(12) United States Patent
Sinha et al.

(10) Patent No.: US 7,685,549 B2
(45) Date of Patent: Mar. 23, 2010

(54) METHOD OF CONSTRAINED AGGRESSOR SET SELECTION FOR CROSSTALK INDUCED NOISE

(75) Inventors: Debjit Sinha, Wappingers Falls, NY (US); Soroush Abbaspour, Fishkill, NY (US); Ayesha Akhter, Austin, TX (US); Gregory M. Schaeffer, Poughkeepsie, NY (US); David J. Widiger, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 11/855,323

(22) Filed: Sep. 14, 2007

(65) Prior Publication Data

US 2009/0077515 A1 Mar. 19, 2009

(51) Int. Cl.
*G06F 17/50* (2006.01)

(52) U.S. Cl. .............................. 716/6; 716/13; 716/14; 703/16

(58) Field of Classification Search .................... 716/6, 716/13, 14; 703/16
See application file for complete search history.

(56) References Cited

U.S. PATENT DOCUMENTS

| | | | | |
|---|---|---|---|---|
| 5,502,644 | A * | 3/1996 | Hamilton et al. | 716/5 |
| 5,901,063 | A * | 5/1999 | Chang et al. | 716/4 |
| 6,018,623 | A * | 1/2000 | Chang et al. | 716/6 |
| 6,128,769 | A * | 10/2000 | Carlson et al. | 716/6 |
| 6,480,998 | B1 * | 11/2002 | Mukherjee et al. | 716/13 |
| 6,499,131 | B1 * | 12/2002 | Savithri et al. | 716/5 |
| 6,615,395 | B1 | 9/2003 | Hathaway et al. | |
| 7,124,381 | B2 | 10/2006 | Lee et al. | |
| 7,181,711 | B2 * | 2/2007 | Foreman et al. | 716/6 |
| 7,251,797 | B2 | 7/2007 | Becer et al. | |
| 7,469,391 | B2 * | 12/2008 | Carrere et al. | 716/4 |
| 2005/0050496 | A1 | 3/2005 | Kovacs et al. | |
| 2005/0204323 | A1 * | 9/2005 | Chen et al. | 716/12 |
| 2005/0246671 | A1 * | 11/2005 | Bois et al. | 716/5 |
| 2005/0246672 | A1 * | 11/2005 | Bois et al. | 716/5 |
| 2006/0112359 | A1 * | 5/2006 | Becer et al. | 716/6 |
| 2006/0143584 | A1 * | 6/2006 | Carrere et al. | 716/5 |

(Continued)

OTHER PUBLICATIONS

Murgan et al., "A Linear Model for High-Level Delay Estimation in VDSM On-Chip Interconnects", IEEE Symposium on Circuits and Systems, vol. 2, May 23-26, 2005, pp. 1078-1081.*

(Continued)

*Primary Examiner*—Phallaka Kik
(74) *Attorney, Agent, or Firm*—H. Daniel Schnurmann (57) ABSTRACT

A preliminary static timing analysis run is performed to calculate the delay and slew as well as timing windows for each net in the design, followed by coupling analysis for each given aggressor-victim combination, and to calculate the noise effect on the timing of victim net. Given a set of functional groups that relate the coupled aggressors to each other, the worst set of aggressors are calculated that satisfy the constraints from the functional groups, based on the calculated impact of each aggressor on the victim. Similarly the set of aggressors which contribute to the maximum amount of inductive coupling noise effect on timing are calculated. Furthermore, the coupling noise impact of the reduced set of aggressors on the given victim line and adjust the delay value calculated in the preliminary static timing analysis run.

24 Claims, 4 Drawing Sheets

U.S. PATENT DOCUMENTS

2006/0248485 A1* 11/2006 Foreman et al. ................ 716/6

OTHER PUBLICATIONS

Chai et al., "Temporo-functional Crosstalk Noise Analysis", Design Automation Conference 2003, pp. 860-863.

Glebov et al., "Delay Noise Pessimism by Logic Correlations", ICCAD 2004, IEEE, pp. 160-167.

Sinha, et al. "Optimal Constrained Agressor Set selection for Crosstalk Induced Delay", IBM Microelectronics, EDA, Hopewell Jn, NY, 5 pages.

* cited by examiner

METHOD OF CONSTRAINED AGGRESSOR SET SELECTION FOR CROSSTALK INDUCED NOISE

FIELD OF THE INVENTION

This invention generally relates to the field of Design Automation, and more particularly, to a system and a method of calculating the impact of coupling noise on static timing and false switching of integrated circuits considering logical constraints between aggressor lines.

BACKGROUND OF THE INVENTION

Static timing analysis (STA) is an essential step in the design of high speed very large scale integrated (VLSI) circuits. STA verifies that a VLSI chip will perform correctly at a required frequency before it is released for manufacturing.

Neighboring wires in a chip induce capacitive coupling effects (hereinafter also referred to as crosstalk) on each other. As CMOS technology scales down, wires inside a chip become taller and thinner. In addition, due to the increase in the design complexity, wires are brought closer to each other. These, altogether, amplify the ratio of the coupling capacitance between the wires to their corresponding grounded capacitances, and thereby, increase the significance of crosstalk on the timing of a VLSI circuit due to the following reasons: 1) if the voltage signals at the output pins of two CMOS drivers which are connected to two neighboring wires are switching in the same direction (i.e., either both rising or both falling), the coupling capacitance between the two wires will force the signals to speed up since the effective capacitance seen by the CMOS drivers is reduced, 2) if the voltage signals at the output pins of two CMOS drivers that are connected to two neighboring wires switch in the opposite direction (i.e., one rising and another one falling), the coupling capacitance between the two wires will force the signals to slow down since the effective capacitance seen by the CMOS drivers are increased. In addition, coupling also causes erroneous or false switchings which may lead to functional failures in a circuit. It should be added that due to the increase in design complexity and wires' current density, inductive coupling effects on timing are becoming critical. Timing analysis considering coupling events is therefore, unavoidable.

Figure 1A:
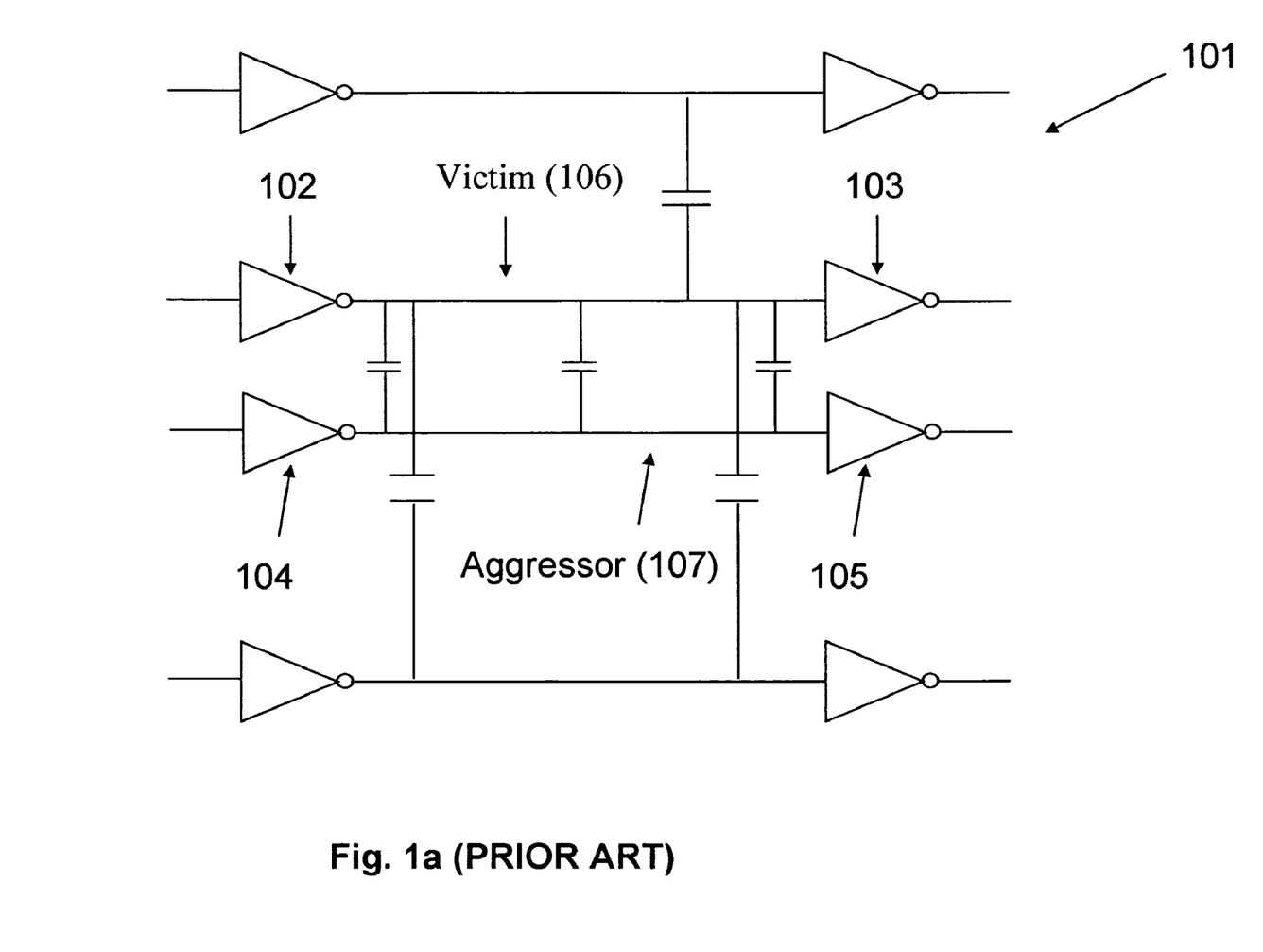
FIG. 1a shows an illustrative example of a prior art circuit having a set of wires on a chip displaying coupling noise effects.

Referring to FIG. 1a, there is shown a set of wires 101 on a chip with coupling between them. To perform coupling analysis, the nets in a design are typically classified into two major groups: 1) victim lines, and 2) aggressor lines. The wire between gate 102 and gate 103 is referred to as the victim 106, while all other neighboring wires 107 are referred to as aggressors to the victim. For instance, the wire driven by gate 104 and received by gate 105 is referred to as aggressor 107. A signal transitioning (switching) on one or multiple aggressors in the temporal vicinity of a victim line induces a signal temporarily on the victim due to electrical coupling. This is referenced as a noise bump. The noise bump can potentially change the logic value at 104 and cause a functional failure. In case the victim is undergoing a signal transition in the temporal vicinity of the time window when the aggressors switch, the induced noise causes a change in the signal propagation and transition time from 102 to 103. This change is often termed coupling induced delay push-out and can cause delay failures in the chip.

To account for functional and delay failures due to coupling during chip design and verification stages, a pessimistic situation is considered where all aggressors are assumed to be switching in a direction that causes the worst possible impact on the victim's timing as described in U.S. Pat. No. 6,615,395 to D. J. Hathaway et al. Only those aggressors whose switching time window overlaps with the victim are considered. The induced noise bump due to these aggressors on the victim is then analyzed for functional verification as well as timing analysis. It has been observed that due to the logical relationship between the lines, all aggressors of a victim line may not switch concurrently.

Figure 1B:
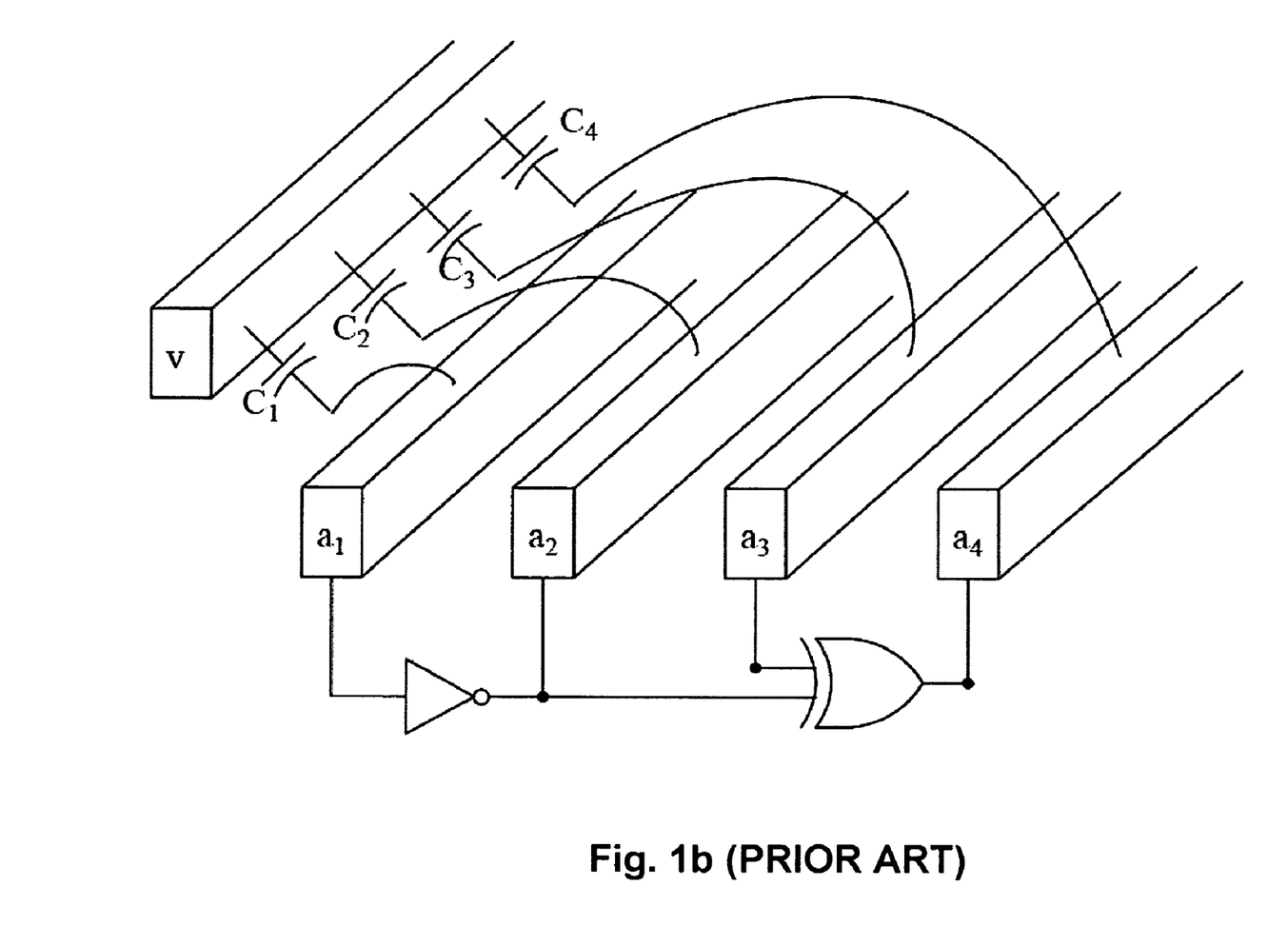
FIG. 1b illustrates a prior art victim net v coupled to four aggressor nets ($a_1$, $a_2$, $a_3$, $a_4$).

Referring to FIG. 1b, there is shown a net v coupled to four (aggressor) nets $a_1$, $a_2$, $a_3$, and $a_4$ having coupling capacitances $C_1$, $C_2$, $C_3$ and $C_4$, respectively. A falling transition on v is considered. In the absence of any functional information, the worst-case delay pushout on v is determined to exist when all its aggressors display a rising transition in the temporal proximity of v's falling transition. However, it is obvious from FIG. 1b that only one of $a_1$ or $a_2$ can rise in a given clock cycle. Similarly, it is observed that at most two of nets $a_2$, $a_3$, and $a_4$ may be rising in a given clock cycle.

Referring back to FIG. 1a, and focusing on the timing impact of the coupling induced noise first, a significant drawback of the prior mentioned coupling analysis method is illustrated using an example of a victim net that is capacitively coupled to a set of aggressors. To compute the worst case impact of noise on the propagation delay and transition time of a given switching victim, it is assumed that all aggressors transition contemporaneously in the opposite direction of the victim line, yielding a pessimistic value for the noise injected on the victim. However, the functional relationship between aggressors may prohibit a scenario where all the aggressor transitions are contemporaneously in the same direction. For example, if the set of aggressors shown in FIG. 1a are the outputs of a decoder, only one of the set of aggressors may transition in a given direction within a clock cycle. In addition, the functional relationship existing between the victim and aggressors may restrict certain late-mode assumptions. Equivalent considerations are similarly applicable to the early-mode analysis when all the aggressors are assumed to be switching in the same direction of the victim. For illustrative purposes, the late-mode scenario will be considered hereinafter.

An approach to reduce pessimism is by accounting for the prior mentioned functional relationships during coupling analysis. However, exhaustive enumeration of all possible combinations of aggressor switchings that do not violate any functional relationship has an exponential complexity and is too time consuming, especially in the presence of a large number of aggressors. In addition, it is not immediately obvious how to evaluate which combination of aggressors satisfying the functional relationships is the worst case for a victim. A set of aggressor switching that satisfy given functional relationships (or logic constraints) is termed a feasible switching.

Prior art methods are described in papers by Chai et al., "Temporo-functional Crosstalk Noise Analysis", Design Automation Conference 2003; and by Glebov et al., "Delay Noise Pessimism by Logic Correlations", ICCAD 2004, both proposing the use of SAT (Satisfyability) and BDD (Binary Decision Diagram) solvers to obtain the worst set of aggressors that satisfy the functional relationships. These are impractical for complex circuits due to large run-times.

SUMMARY AND OBJECTS OF THE INVENTION

It is a primary object of the invention to provide a system and a method for efficiently calculating the impact of coupling noise considering logical constraints between aggressor lines.

It is another object of the invention to perform a preliminary STA run to calculate the delay and slew as well as timing windows for each net in the design, followed by coupling analysis for each given aggressor-victim combination, and to calculate the noise effect on the timing of the victim net.

It is still another object of the invention to calculate a worst set of aggressors that satisfy the constraints from the functional groups based on the calculated impact of each aggressor on the victim, given a set of functional groups that relate the coupled aggressors to each other.

It is yet another object of the invention to determine the set of aggressors that contribute to the maximum amount of inductive coupling noise effect on timing.

It is a further object of this invention to calculate the coupling noise impact of the reduced set of aggressors on the given victim line and adjust the delay value calculated in the preliminary STA run.

These and other objects, aspects and advantages of the invention are provided by a method of selecting a constrained aggressor set for crosstalk induced noise that effectively reduces the pessimism of performing coupling induced static timing analysis. The method further reduces the pessimism during coupling induced false switching analysis of circuits.

In one aspect of the present invention, a set of aggressor nets (or aggressors) that potentially induces maximum coupling noise/delay on a given victim net under logical constraints is selected. The constraints assign aggressors to certain groups and restrict the maximum number of aggressors in any group that may be switching in a given clock cycle. This process helps reduce the pessimism in the overall coupling impact on the timing by eliminating false interactions. An aggressor may belong to multiple groups. The straight forward approach of finding an optimal solution to this problem by exhaustive enumeration of all possible solutions is unattractive since it has a worst case exponential complexity and does not scale well with the increasing numbers of aggressors and groups.

In another aspect of the invention, the method can be formulated mathematically wherein some specific cases are formulated as Linear Programming (LP) problems. Linear programming problems involve the optimization of a linear objective function, and are subject to linear equality and inequality constraints. Informally, LP achieves the best outcome using the linear mathematical model. Lagrangian Relaxation (LR) and generalized network flow based techniques are presented that can compute the optimal solution. It has been further demonstrated that by allowing a sub-optimal solution, one can speed up the LR approach significantly. The approach is efficient and has polynomial complexity. The aforementioned techniques can be integrated in existing algorithms that analyze the impact of coupling on timing. The method of the present invention also accounts for noise susceptibility of gates during coupling analysis, combining it with the aggressor set selection process. In addition, the proposed techniques are compatible with both a Miller factor type of coupling analysis algorithm, as well as a dynamic delay adjusted algorithm.

In another aspect of the invention, there is provided a method of obtaining an optimal set of coupled aggressors for each victim in an integrated circuit (IC) chip design, the method comprising the steps of: a) determining functional groups relating the coupled aggressors to each other; b) for each aggressor to a victim, determining an aggressor's impact on the victim; c) determining a set of essentially worst aggressors that satisfies constraints from the functional groups based on a measured impact of each aggressor on the victim, and d) providing the optimal set of coupled aggressors using said set of essentially worst coupled aggressors of each victim in the IC chip design.

BRIEF DESCRIPTION OF DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

DETAILED DESCRIPTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail.

Figure 2:
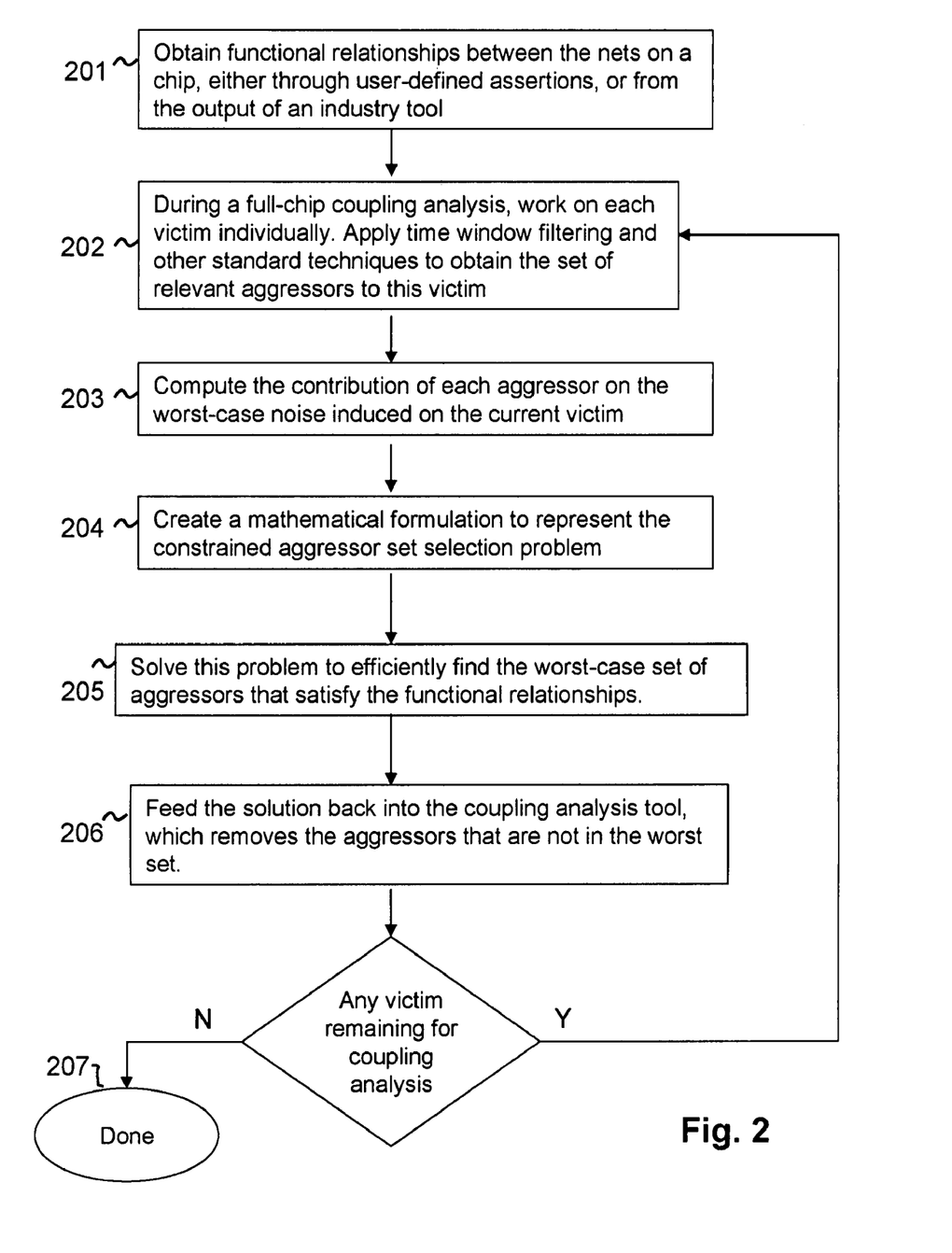
FIG. 2 is a flowchart illustrating the steps of the present invention.

Referring to FIG. 2, there is shown a method for computing the worst feasible set of aggressors of a victim according to the present invention. Hereinafter are described solutions for a capacitively coupled set of nets. These solutions can advantageously be extended to include inductive coupling, as will be explained later.

In block 201 functional relationships between nets in a chip is obtained. This can be determined using industry standard functional analysis tools or asserted by the designer. Aggressor groups are formed to represent functional relationships. Each aggressor group contains a set of aggressors wherein each aggressor is associated with a particular switching direction. A number that denotes the maximum number of aggressors in the group that is known to be switching (in a given direction) is associated with each group. An aggressor may belong to multiple groups. Groups may be specified differently for rising and falling transitions. For example, one may have a rising aggressor group containing four nets $a_1$, $a_2$, $a_3$ and $a_4$ with the constraint that at most two of the four aggressors may be considered switching in any clock cycle. For a victim undergoing a fall transition and coupled to these four aggressors, the group constraint implies that one may consider only two of the four aggressors to have a rising transition and use it to compute the induced noise in the worst case. Note that this constraint is applied in addition to other constraints including that the nets must overlap in their time windows, the coupling capacitance being larger than a given threshold, etc. Other prior art filtering techniques for pessimism reduction can be applied as well. These filters are shown being applied to each victim during coupling analysis in block 202.

In the next step (block 203), the contribution of each aggressor on the worst case noise induced on the victim is computed. The impact of each aggressor on the victim is denoted using a score, i.e., a metric associated with each aggressor. A higher score for an aggressor implies that it has a larger impact on the victim. Several approaches can be employed for this step. Simulation based or interconnect analysis based approaches are preferably used to calculate the worst change in delay or slew at the receiving gate of the victim net due to coupling for each victim-aggressor pair, while maintaining all other aggressors at a fixed logic state. A change in delay, slew, or a combination of both can be used as the aggressor's score. Alternately, the noise bump induced by each aggressor on the victim when the victim and all other aggressors are held at a fixed logic state can be calculated. A metric using a combination of the noise bump peak and/or width may be advantageously employed as the score for that aggressor. The power associated with the induced noise bump is another metric for an aggressor score. Other simplistic approaches include using the total coupling capacitance between each aggressor-victim pair as the score, or using some form of equation based delay push out (e.g., Elmore delay) for the aggressor score. The present invention can readily be extended to support any scoring mechanism. For the moment, the cumulative impact of noise on a victim due to all aggressors computed from the independently computed aggressor scores will be considered.

In block 204, the constrained aggressor set selection problem is formulated. For illustrative purposes, a victim net v and a set of m capacitively coupled aggressor nets $a_1, a_2 \ldots a_m$ is considered. A falling transition on the victim and rising transitions on the aggressors for worst case coupling induced delay are assumed. Each aggressor $a_i$ is associated with a score $\psi_i$, which is computed using an approach mentioned in 203. Based on given functional information, a set of n aggressor groups is provided, which is denoted as $g_1, g_2, \ldots, g_n$. An aggressor may belong to multiple groups. Functional information imposes constraints that at most $N_i$ aggressors in group $g_i$ can switch (for this example, the term "switch" implies that the aggressors undergo a rise transition) within a given clock cycle. Given the above information and constraints, the objective of the problem being considered is to find a feasible set of switching (rising) aggressors that maximize the noise induced on the victim net v.

To denote mathematically if an aggressor $a_i$ belongs to a group $g_j$, a set of variables $x_{ij}$ is defined for each $1 \leq I \leq m$ and $1 \leq j \leq n$ as follows:

$$x_{ij} = \begin{cases} 1 & \text{if aggressor } a_i \text{ belongs to group } g_j \\ 0 & \text{otherwise} \end{cases}$$

For the set of aggressors that can be considered switching (rising) for a maximal induced noise on the victim, another set of variables $s_i$ is defined for each $1 \leq i \leq m$ as follows:

$$s_i = \begin{cases} 1 & \text{if } a_i \text{ is considered switching} \\ 0 & \text{otherwise} \end{cases}$$

The total noise induced on the victim is thus expressed as $$\sum_{i=1}^{m} \psi_i s_i.$$

This implies that the total noise on the victim is due to noise from only those aggressors that are considered switching.

The constraint that at most $N_j$ aggressors in group $g_j$ could switch within a given clock cycle is expressed mathematically as:

$$\sum_{i=1}^{m} x_{ij} s_i \leq N_j$$

The problem under consideration can now be expressed as:

$$\text{maximize} \sum_{i=1}^{m} \psi_i s_i$$

s.t.

$$\sum_{i=1}^{m} x_{i1} s_i \leq N_1$$

$$\sum_{i=1}^{m} x_{i2} s_i \leq N_2$$

$$\vdots$$

$$\sum_{i=1}^{m} x_{in} s_i \leq N_n$$

$0 \leq s_i \leq 1$, $s_i$ is an integer, and $1 \leq i \leq m$

The problem is an Integer Linear Programming problem, which is a special case of Linear Programming where some variables are integers. However, it can be shown that the problem can be advantageously treated as a linear programming problem. Briefly, two 'smart' methods of solving the problem optimally and efficiently are described in block 205. In the first method, the problem is solved using Lagrangian Relaxation (hereinafter, referenced as LR). Details thereof are described by Ahuja et al. in a textbook entitled Network Flows: Theory, Algorithms and Application. LR is a widely known methodology for solving mathematical problems.

Following the LR process, selected constraints from the optimization problem are relaxed and added to the objective function after multiplying them with non-negative multipliers. A new simpler problem referred to as the LR sub-problem is formulated, the solution thereof being an upper bound to the solution of the original problem. For a sub-problem, constraints for each aggressor group are relaxed. The new problem, having a linear complexity, can be easily solved by inspection. The problem of finding multipliers so that the solution to the new problem is identical to the solution of the original problem, is referred to as the LR dual problem, and can be solved by prior art methods like multiplier-ascent, network flow, or sub-gradient optimization, as described by Ahuja et al. Furthermore, the runtime accuracy tradeoff can be performed at this stage by allowing a small error in the final solution that allows the routine to converge faster, and which significantly speeds-up its execution. LR may also be used to obtain bounds on the optimal solution, and guide the branch-and-bound solver.

The problem can also be formulated as a network flow problem. A directed graph G=(V,E) is defined with cost cost(i, j) and the capacity $u_{ij}$ associated with every arc (i, j) in the graph. $f_{ij}$ is used to denote the flow value on the arc (i,j). In the graph, a node $\eta_{ai}$ corresponding to each aggressor net $a_i$, and a node $\eta_v$ corresponding to the victim net v are introduced. Also introduced is a node $\eta_{gj}$ in the graph G corresponding to each aggressor group $g_j$. Finally, a dummy source node $\eta_s$ in G is likewise also introduced, as well as an arc from the dummy source node $\eta_s$ to each aggressor node $\eta_{ai}$. The capacity of each arc $(\eta_s, \eta_{ai})$ is set to 1. The cost associated with this arc is set to the negative of the aggressor score for the corresponding aggressor $a_i$, that is $cost(\eta_s, \eta_{ai}) = -\psi_i$.

For every aggressor $a_i$ and group $g_j$ pair such that $a_i$ belongs to $g_j$, an arc from node $\eta_{ai}$ to node $\eta_{gj}$ is introduced. The capacity of each of these arcs is set to 1, and the cost is set to 0. Next, for each node $\eta_{gj}$ in the graph, an arc $(\eta_{gj}, \eta_v)$ is introduced. The cost $cost(\eta_{gj}, \eta_v)$ associated with each of these arcs is set to 0, while the corresponding capacity is set to $N_j$ (the maximum number of aggressors in group $g_j$ that can switch in a clock cycle). Finally an arc from $\eta_s$ to $\eta_v$ is introduced such that $cost(\eta_s, \eta_v)=0$, and its capacity is m. To each node in the graph a value b(i) associated thereto and denoting its supply (or demand if b(i)<0). $B(\eta_s)$ is set to m, and $b(\eta_v)$ to −m. Each $b(\eta_{gj})$ is set to 0. For each aggressor node $\eta_{ai}$, $b(\eta_{ai})$ is set to 0 if there is no incoming flow along the arc $(\eta_s, \eta_{ai})$, and to one less than its number of fan-out arcs times the incoming flow. Mathematically, this can expressed as $$b(\eta_{a_i}) = f_{\eta_s \eta_{a_i}} \left( \sum_{j=0}^{n} x_{ij} - 1 \right)$$

A generalized minimum cost flow problem on this graph is solved using prior art approaches like the generalized network simplex algorithm. From the solution obtained, one can set the variable $s_i$ in the original problem to $f_{\eta_s \eta_{ai}}$. This yields the optimal solution to each $s_i$. An integral solution for each $s_i$ is guaranteed since the final flows on a graph with integral capacities, supplies, and costs are always an integral. In the present case, one can advantageously scale the costs (or the negative of the aggressor scores) to be integral, thereby guarantying an integral optimal solution.

Once the worst set of feasible aggressors has been determined, this information is fed back into the coupling analysis tool. The noise on the victim may be computed by adding the scores for the switching aggressors. Alternately, the aggressors that are not considered switching are filtered out, and a simulation is performed to evaluate the noise on the victim when all the remaining aggressors are switching together. This is shown in block 206. Once all victims have been analyzed, the iterative coupling analysis process terminates, as shown in block 207.

The previously described invention can be readily extended to the problem of analyzing coupling noise induced false switching or functional noise. Additionally, one can consider the noise susceptibility characteristics of the victim's receiving gate. The characteristic of a gate that determines its susceptibility to noise is often expressed as a noise rejection curve (NRC) that denotes the maximum noise that a gate can tolerate. Given the width and peak of an induced noise bump, NRC is expressed as a function of the noise bump width, and gives that maximum peak of the noise bump that the victim can tolerate without failure.

Figure 3:
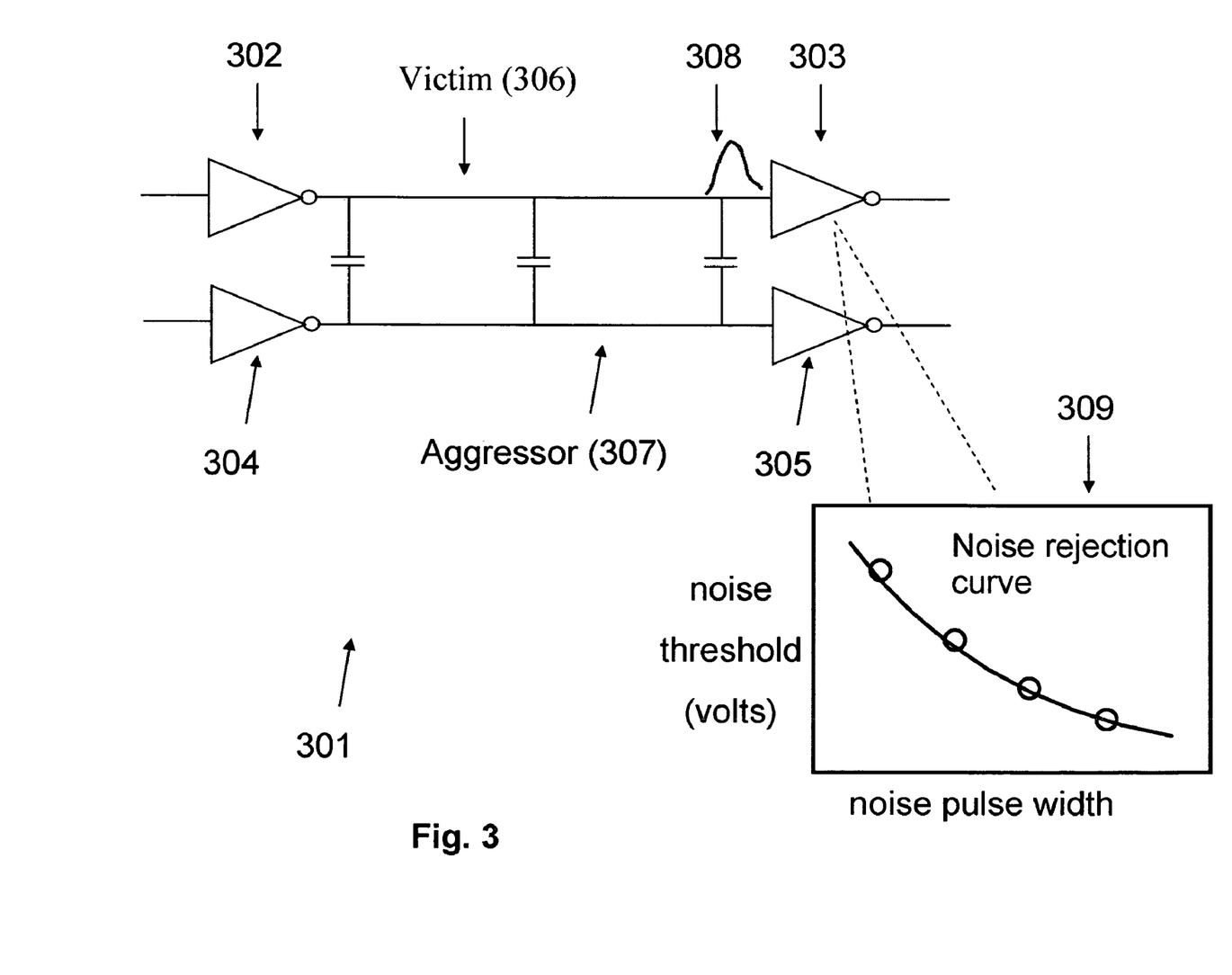
FIG. 3 illustrates a case having injected noise, and the noise rejection curve of the victim receiver gate.

Referring now to FIG. 3, a noise bump 308 with width $w_T$ and peak $p_T$ is shown to be induced on a victim net that has a receiving gate 303. The noise rejection curve for 303 is shown in 309. The difference between the $p_T$ and the NRC evaluated at $w_T$ denotes the amount of noise that exceeds the gate's noise susceptibility.

The 'greedy approach' would be to find a feasible switching of aggressors that maximize the peak of the induced noise bump for the worst case impact of noise. Instead, one should find the set of aggressors that maximize the amount of noise that exceeds the gate's noise susceptibility. It is observed from NRC that it is possible to have a noise bump peak that exceeds the NRC while a noise bump with a larger peak may not exceed it.

Shown hereinafter is a method to formulate an objective function for the aggressor set selection problem when the NRC of the victim's receiver is considered. The peak and width of the noise bump induced due to an aggressor are denoted by $a_i$ using $p_i$ and $w_i$, respectively. One way to express the peak of the cumulative noise bump in the worst case for the set of aggressors is by adding the peak of each noise bump induced by aggressors that are considered switching. This is expressed mathematically as:

$$p_T = \sum_{i=1}^{m} p_i s_i$$

To compute the width of the cumulative noise bump, the total area of the cumulative noise is matched with that of the sum of the individual noise bumps. In this process, a triangular shape for the noise bumps is assumed. The width of the cumulative noise bump is thus computed as:

$$w_T = \frac{\sum_{i=1}^{m} p_i w_i s_i}{\sum_{i=1}^{m} p_i s_i}$$

Given the cumulative noise peak and width, it is desirable to maximize the amount by which the peak exceeds the NRC of the victim driver evaluated at the cumulative noise bump width. This is expressed as:

maximize $p_T - NRC(w_T)$

By way of example, let it be considered that NRC is mathematically expressed as:

$$NRC(w) = k_1 + \frac{k_2}{w},$$

for some constants $k_1$ and $k_2$.

The aggressor set selection problem is now expressed as:

maximize $p_T - \left( k_1 + \frac{k_2}{w_T} \right)$ s.t.

-continued $$\sum_{i=1}^{m} x_{i1} s_i \leq N_1$$

$$\sum_{i=1}^{m} x_{i2} s_i \leq N_2$$

$$\vdots$$

$$\sum_{i=1}^{m} x_{in} s_i \leq N_n$$

$0 \leq s_i \leq 1$ and $s_i$ is an integer, and $1 \leq i \leq m$ where, $p_T$ and $w_T$ are as shown above. Mathematical solvers are employed to find the worst feasible set of aggressors for this problem. LR can be advantageously used for solving such problems.

Furthermore, the proposed approaches are extensible to include inductive coupling. Worst case noise bumps induced due to capacitive or inductive coupling (or a combination of both) can be obtained using industry noise analysis tools for each aggressor for different switching directions. The corresponding score can be then used in its formulation.

Finally, the method for the aggressor set selection can be employed at multiple stages of a typical iterative coupling analysis algorithm. In one method, the aggressor set selection may be used only at the last step of the iterations for pessimism reduction. In another method, the filtering technique may be used in each iteration for the victim nets for the victim nets. The aggressor set selection method may also be employed before any timing analysis using default values of input slews for the aggressor and victim nets, assuming a complete time window overlap between all nets. This provides a method for quick aggressor filtering and pessimism reduction while avoiding expensive coupling iterations.

The present invention can be realized in hardware, software, or a combination of hardware and software. The invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of obtaining an optimal set of coupled aggressors for a given victim in an integrated circuit (IC) chip design to enhance said IC chip design, said given victim comprising a single noise event, the method comprising
    a) determining functional groups for said single noise event that relate the coupled aggressors of said single noise event to each other;
    b) for each aggressor to said single noise event, determining the aggressor's contribution to said single noise event;
    c) determining a set of essentially worst coupled aggressors that satisfies constraints from said functional groups based on a measured contribution of each aggressor on said single noise event;
    d) providing by a computer said optimal set of coupled aggressors using said set of essentially worst aggressors to said single noise event; and
    e) modifying said IC chip design by supplying thereto results from said optimal set of coupled aggressors to a timing analysis of said IC design.

2. The method as recited in claim 1, wherein in step a) each functional group further comprises information on a number of aggressors that make a transition concurrently.

3. The method as recited in claim 1, wherein in step a) each functional group further comprises information on which direction the aggressors make a transition concurrently.

4. The method as recited in claim 1, wherein in step a) each functional group further comprises information on which timing analysis mode is affected by the functional group.

5. The method as recited in claim 1, wherein the aggressors are capacitively coupled to the victim.

6. The method as recited in claim 1, wherein the aggressors are inductively coupled to the victim.

7. The method as recited in claim 1, wherein the aggressors are capacitively and inductively coupled to the victim.

8. The method as recited in claim 1, wherein in step b), the impact of each aggressor is determined by computing a change in delay of the victim due to the aggressor.

9. The method as recited in claim 8, wherein in step b), the impact of each aggressor is measured by computing the change in effective capacitance of the victim due to the aggressor.

10. The method as recited in claim 8, wherein in step b), the impact of each aggressor is measuring by computing the noise injected onto the victim by the aggressor.

11. The method as recited in claim 1, wherein in step b), the impact of each aggressor is measured by computing a noise slack, defined by comparing an injected noise into a victim's noise rejection curve.

12. The method as recited in claim 1, wherein in step b), the impact of each aggressor is measured by computing a change in slew of the victim due to the aggressor.

13. The method as recited in claim 1, wherein in step b), the impact of each aggressor is measured using a statistical timing and noise analysis engine.

14. The method as recited in claim 1, wherein a given aggressor belongs to more than one functional group.

15. The method as recited in claim 1, wherein in step c), the worst set of aggressors is calculated by constructing a Linear Programming (LP) problem.

16. The method as recited in claim 1, wherein in step c), the worst set of aggressors is determined by performing Lagrangian Relaxation.

17. The method as recited in claim 1, wherein in step c), the worst set of aggressors is determined by constructing a network flow problem.

18. The method as recited in claim 1, wherein steps (a) through (c) are performed within a timing analysis program on said IC chip design.

19. The method as recited in claim 1, wherein steps (a) through (c) are performed within a functional noise analysis program of said IC chip design.

20. The method as recited in claim 1, wherein steps (a) through (c) are performed within a noise impact determination on a timing program.

21. The method as recited in claim 1, wherein said constraints assign the aggressors to selected groups and restrict a maximum number of aggressors in any group that switch in a clock cycle.

22. The method as recited in claim 21, wherein the constraints' assigned aggressors are selected by their ability to reduce pessimism in a coupling impact on timing by eliminating false interactions.

23. The method as recited in claim 21, wherein said aggressors are assigned to multiple groups.

24. A program storage device readable by a machine, tangibly embodying a program of instructions executable by the machine to perform method steps for determining an optimal set of coupled aggressors for a given victim in an integrated circuit (IC) chip design, said given victim comprising a single noise event, the method comprising:
   a) determining functional groups for said single noise event that relate the coupled aggressors of said single noise event to each other;
   b) for each aggressor to said single noise event, determining the aggressor's contribution to said single noise event;
   c) determining a set of essentially worst aggressors that satisfies constraints from said functional groups based on a measured contribution of each aggressor on said single noise event;
   d) providing by a computer said optimal set of coupled aggressors using said set of essentially worst coupled aggressors to said single noise event; and
   e) modifying said IC chip design by supplying thereto results from said optimal set of coupled aggressors to a timing analysis of said IC design.

* * * * *